United States Patent
Möttönen et al.

(10) Patent No.: US 11,909,395 B2
(45) Date of Patent: Feb. 20, 2024

(54) METHOD AND ARRANGEMENT FOR READING OUT THE STATE OF A QUBIT

(71) Applicant: IQM Finland Oy, Espoo (FI)

(72) Inventors: Mikko Möttönen, Espoo (FI); Joni Ikonen, Helsinki (FI); Jan Goetz, Espoo (FI)

(73) Assignee: IQM Finland Oy, Espoo (FI)

( * ) Notice: Subject to any disclaimer, the term of this patent is extended or adjusted under 35 U.S.C. 154(b) by 388 days.

(21) Appl. No.: 17/284,390

(22) PCT Filed: Oct. 10, 2019

(86) PCT No.: PCT/FI2019/050726
§ 371 (c)(1),
(2) Date: Apr. 9, 2021

(87) PCT Pub. No.: WO2020/074783
PCT Pub. Date: Apr. 16, 2020

(65) Prior Publication Data
US 2021/0336621 A1    Oct. 28, 2021

(30) Foreign Application Priority Data
Oct. 10, 2018   (FI) .................................... 20185847

(51) Int. Cl.
*H03K 19/164* (2006.01)
*G06N 10/00* (2022.01)
(Continued)

(52) U.S. Cl.
CPC .......... *H03K 19/164* (2013.01); *G06N 10/00* (2019.01); *H01P 7/086* (2013.01); *H10N 60/12* (2023.02); *B82Y 10/00* (2013.01)

(58) Field of Classification Search
CPC ...................................................... G06N 10/00
(Continued)

(56) References Cited

U.S. PATENT DOCUMENTS

2013/0278283 A1* 10/2013 Berkley ................. G06N 10/00
326/5
2017/0262765 A1    9/2017 Bourassa
(Continued)

FOREIGN PATENT DOCUMENTS

WO    2017139683    8/2017
WO    2017151200    9/2017

OTHER PUBLICATIONS

Finnish Search Report issued by the Finnish Patent and Registration Office to FI Application No. 20185847, dated Apr. 23, 2019, 2 pages.
(Continued)

*Primary Examiner* — Joseph Chang
(74) *Attorney, Agent, or Firm* — Meunier Carlin & Curfman LLC (57) ABSTRACT

For reading out a state of a qubit, a readout input waveform is injected into a system that comprises an information storage element for storing the state of the qubit and a readout resonator that is electromagnetically coupled to said information storage element. A readout output waveform is extracted from said system and detected. The injection of the readout input waveform takes place through an excitation port that is also used to inject excitation waveforms to the information storage element for affecting the state of the qubit. A phase of the readout input waveform is controllably shifted in the course of injecting it into the system.

13 Claims, 9 Drawing Sheets

(51) Int. Cl.
*H01P 7/08* (2006.01)
*H10N 60/12* (2023.01)
*B82Y 10/00* (2011.01)

(58) Field of Classification Search
USPC .......................................................... 307/413
See application file for complete search history.

(56) References Cited

U.S. PATENT DOCUMENTS

| | | | |
|---|---|---|---|
| 2021/0036206 A1* | 2/2021 | Neill | H10N 60/805 |
| 2021/0279624 A1* | 9/2021 | Oliver | G06N 10/40 |

OTHER PUBLICATIONS

International Preliminary Report on Patentability issued by the EPO to Application No. PCT/FI2019/050726, dated Jan. 21, 2021, 18 pages.

Chen Yu et al., "Multiplexed dispersive readout of superconducting phase qubits", Applied Physics Letters, AIP Publishing LLC, US, vol. 101, No. 18, Oct. 29, 2021, pp. 182601-182601, XP02165547, ISSN: 0003-6951, DOI: 10.1063/1.4764940 [retrieved on Nov. 1, 2012].

Touzard S et al., "Gated conditional displacement readout of superconducting qubits", arxiv.org, Cornell University Library, 201 Olin Library Cornell University Ithaca, NY, Sep. 19, 2018, XP081084648, DOI: 10.1103/PHYSREVLETT.122.080502.

McClure, D.T. et al., "Rapid Driven Reset of a Qubit Readout Resonator", arXiv: 1503.01456v2, In: arXiv.org, Cornell University Library [online], May 22, 2015, pp. 1-5, [retrieved on Apr. 18, 2019]. Retrieved from <https://arxiv.org/abs/1503.01456v2> abstract; p. 1, right column, first paragraph; Fig. 3.

Opremcak, A. et al., Measurement of a Superconducting Qubit with a Microwave Photon Counter. arXiv: 1803.01014v1. In: arXiv.org, Cornell University Library [online], Mar. 2, 2018, pp. 1-11. [retrieved on Apr. 1, 2019]. Retrieved from <https://arxiv.org/abs/1803.01014v1> abstract; Fig. 1.

Konen J. et al., "Qubit Measurement by Multi-Channel Driving", arXiv: 1810.05465v2. In: arXiv.org, Cornell University Library [online], Feb. 25, 2019; pp. 1-15, [retrieved on Apr. 9, 2019]. Retrieved from <https://arxiv.org/abs/1810.05465v2> the whole document.

Wirth T. et al., "Microwave readout scheme for a Josephine phase qubit", Applied Physics Letters, published online Dec. 30, 2010, [retrieved Oct. 5, 2010].

Steffen M., "Readout for Phase Qubits without Josephson Junctions", IBM Watson Research Center, arXiv: 1001.1453v1, dated Jan. 9, 2010.

\* cited by examiner

$$\hat{H}_{total} = \hat{H}_0 + \hat{H}_{int} + \hat{H}_{QD} + \hat{H}_{RD} \quad (1)$$

$$\hat{H}_0/\hbar = \omega_r \hat{a}^\dagger \hat{a} + \sum_{k=0} \omega_k |k\rangle \langle k| \quad (2)$$

$$\hat{H}_{int}/\hbar = \sum_{k=0} g_k (\hat{a}^\dagger + \hat{a})(|k\rangle \langle k+1| + |k+1\rangle \langle k|) \quad (3)$$

$$\hat{H}_{QD}/\hbar = 2\tilde{\Omega}_{qd}(t) \sum_{k=0} \lambda_k (|k\rangle \langle k+1| + |k+1\rangle \langle k|) \quad (4)$$

$$\hat{H}_{RD}/\hbar = 2\tilde{\Omega}_{rd}(t)(\hat{a}^\dagger + \hat{a}) \quad (5)$$

$$\tilde{\Omega}_{r/q}(t) = \text{Re}(\Omega_{r/q})\cos(\omega_d t) + \text{Im}(\Omega_{r/q})\sin(\omega_d t) \quad (6)$$

$$\hat{U}_1 = \exp\left[it\left(\omega_d \hat{a}^\dagger \hat{a} + \sum_k k\omega_d |k\rangle \langle k|\right)\right] = e^{it\omega_d \hat{a}^\dagger \hat{a}} \sum_k e^{it\omega_d k} |k\rangle \langle k| \quad (7)$$

Fig. 5

$$\hat{H}'_0/\hbar = \hat{U}_1 \hat{H}_0 \hat{U}_1^\dagger/\hbar = (\omega_r - \omega_d)\hat{a}^\dagger \hat{a} + \sum_k \tilde{\Delta}_k |k\rangle\langle k| \quad (8)$$

$$\hat{H}'_{\text{int}}/\hbar \approx \sum_k g_k \hat{a}^\dagger |k\rangle\langle k+1| + \text{H.c.} \quad (9)$$

$$\hat{H}'_{\text{QD}}/\hbar \approx \Omega_q \sum_k \lambda_k |k+1\rangle\langle k| + \text{H.c.} \quad (10)$$

$$\hat{H}'_{\text{RD}}/\hbar \approx \Omega_r \hat{a}^\dagger + \text{H.c.} \quad (11)$$

Fig. 6

$$\hat{H}'_{\text{total}} \approx (\omega_r - \omega_d)\hat{a}^\dagger \hat{a} + \sum_k \tilde{\Delta}_k |k\rangle\langle k| + \sum_k \{[g_k \hat{a}^\dagger + \Omega_q \lambda_k]|k+1\rangle\langle k| + \text{H.c.}\} \quad (12)$$

$$\dot{\rho} = -i[\hat{H}'_{\text{total}}, \rho]/\hbar + \frac{\kappa}{2}\mathcal{L}[\hat{a}]\rho \quad (13)$$

$$\hat{U}_2 = e^{\sum_k \frac{g_k}{\tilde{\Delta}_{k+1} - \tilde{\Delta}_k}(\hat{a}|k+1\rangle\langle k| - \hat{a}^\dagger |k\rangle\langle k+1|)} \quad (14)$$

$$\left(\hat{H}''_0 + \hat{H}''_{\text{int}}\right)/\hbar \approx \left(\tilde{\Delta}_1 + \chi_0\right)|e\rangle\langle e| + \left(\tilde{\Delta}_2 + \chi_1\right)|f\rangle\langle f|$$
$$+ [\omega_r - \omega_d - \lambda_0]|g\rangle\langle g| + (\chi_0 - \chi_1)|e\rangle\langle e| + \chi_1 |f\rangle\langle f|]\hat{a}^\dagger \hat{a} \quad (15)$$

$$\hat{H}''_{\text{QD}}/\hbar \approx \alpha_{vo}g_0 |e\rangle\langle g| + \alpha_{vo}g_1 |f\rangle\langle e|$$
$$- \alpha^*_{vo}\chi_0 \hat{a}|g\rangle\langle g| + (\chi_0 - \chi_1)\alpha^*_{vo}\hat{a}|e\rangle\langle e| + \alpha^*_{vo}\chi_1 \hat{a}|f\rangle\langle f| + \text{H.c.} \quad (16)$$

$$\hat{H}''_{\text{RD}}/\hbar \approx \Omega_r \left(\hat{a}^\dagger + \frac{\chi_0}{g_0}|e\rangle\langle g| + \frac{\chi_1}{g_1}|f\rangle\langle e|\right) + \text{H.c.} \quad (17)$$

Fig. 7

$$H''_{total}/\hbar \approx \chi_0|\alpha_{vo}|^2|g\rangle\langle g| + [\tilde{\Delta}_1 + \chi_0 - |\alpha_{vo}|^2(\chi_0 - \chi_1)]|e\rangle\langle e| + [\tilde{\Delta}_2 + \chi_1(1-|\alpha_{vo}|^2)]|f\rangle\langle f| \quad (18)$$

$$+ \left[\left(-ig_0 + \Omega_r\frac{\chi_0}{\eta_0}\right)|e\rangle\langle g| + \left(-ig_1 + \Omega_r\frac{\chi_1}{\eta_1}\right)|f\rangle\langle e| + \text{H.c.}\right] \quad (19)$$

$$+ [i\omega_r - \omega_d - \chi_0|g\rangle\langle g| + (\chi_0 - \chi_1)|e\rangle\langle e| + \chi_1|f\rangle\langle f|]\hat{b}^\dagger\hat{b} \quad (20)$$

$$+ [\Omega_r + \alpha_{vo}(\omega_r - \omega_d)]\hat{b}^\dagger + \text{H.c.} \quad (21)$$

Fig. 8

$$\frac{\partial\alpha_{g/e}(t)}{\partial t} = i\Omega_r' \pm i\chi[\alpha_{g/e}(t) - \alpha_{vo}] - \frac{\kappa}{2}\alpha_{g/e}(t) \quad (22)$$

$$\alpha_{g/e}(t) = \frac{-\Omega_r \pm \Omega_r\chi/g}{i\kappa/2 \mp \chi}\left(1 - e^{-\frac{\kappa}{2}t \mp it\chi}\right) \quad (23)$$

Fig. 9

$$S_{conv}(t) = |\alpha_e(t) - \alpha_g(t)| = \frac{\Omega_{rd}}{4} |\chi_{|e\rangle} - \chi_{|g\rangle}| t^2 + \mathcal{O}(t\chi)^3 \quad (24)$$

$$S_{back}(t) = |\alpha_e(t) - \alpha_g(t)| = \frac{\Omega_{qd}}{2g} t |\chi_{|g\rangle} - \chi_{|e\rangle}| \left(1 - \frac{1}{2}\kappa t\right) + \mathcal{O}(t\chi)^3 \quad (25)$$

METHOD AND ARRANGEMENT FOR READING OUT THE STATE OF A QUBIT

PRIORITY CLAIM

This application is a national phase entry of PCT/FI2019/050726, filed on Oct. 10, 2019, which claims priority to Finnish Patent Application No. 20185847, filed on Oct. 10, 2018, the entire disclosures of which are incorporated by reference herein.

FIELD OF THE INVENTION

The invention is generally related to the technology of quantum computing. In particular the invention is related to the technology of reading out the state of a qubit in a fast and reliable manner.

BACKGROUND OF THE INVENTION

In quantum computing it has become common to use the term qubit to designate not only the basic unit of information but also the information storage element that is used to store one qubit of information. As an example, a superconductive memory circuit with one or more qubits (i.e. qubit-sized information storage elements) can be considered. In such an example the qubit is an anharmonic oscillator, such as a transmon, and it may be coupled to a nearby readout resonator for facilitating the readout of the state of the qubit stored therein.

Figure 1:
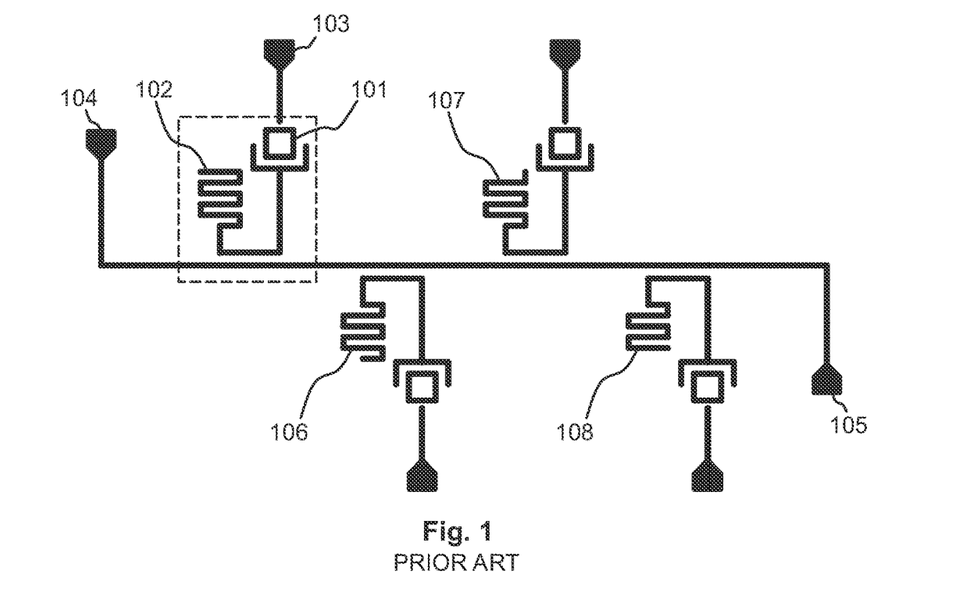
FIG. 1 illustrates a superconductive quantum memory circuit.

FIG. 1 is a schematic illustration of an example of a memory circuit that contains four qubits (i.e. four qubit-sized information storage elements). The top left qubit 101 and its associated microwave resonator 102 are seen in the dashed rectangle. The transmission lines shown with thick, solid lines, as well as the internal structures of the qubits, are made of a material that becomes superconductive at low temperatures. During operation the qubit 101 can be excited with an excitation waveform of certain frequency that is brought to the excitation port 103. The long horizontal transmission line is the readout line. For reading out the stored value of the qubit a readout waveform is coupled to a readout input port 104, and the phase of the resulting readout signal is detected at a readout output port 105. Each of the four resonators 102, 106, 107, and 108 in this exemplary circuit has a different resonance frequency, so that the frequency of the readout waveform determines, which of the qubits is actually read.

Figure 2:
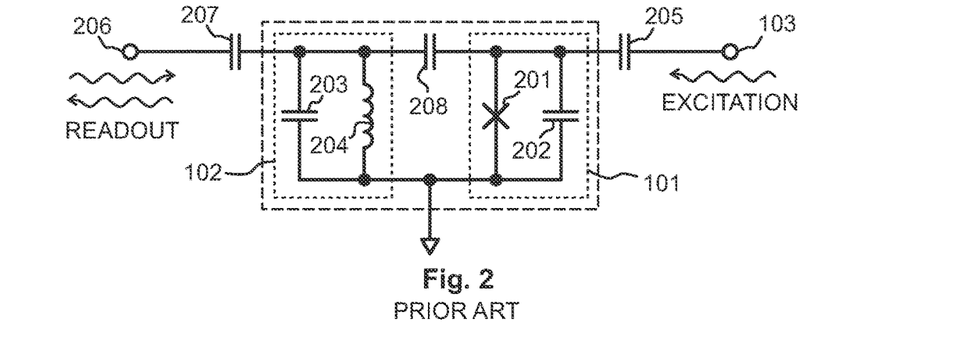
FIG. 2 illustrates an equivalent circuit diagram.

FIG. 2 is an equivalent circuit diagram that represents a qubit 101 and its associated resonator 102. The qubit 101 consists of a Josephson junction 201 and a shunting capacitance 202. The resonator is shown as an LC circuit that consists of a capacitance 203 and an inductance 204. The excitation port 103 corresponds to that of FIG. 1, and it is coupled to the qubit through a coupling capacitance 205. The readout port 206 of FIG. 2 combines the functions of the readout input port 104 and readout output port 105 of FIG. 1, and its coupling capacitance to the resonator 102 is shown as 207. The capacitance 208 in the middle represents the predominantly capacitive electromagnetic coupling between the qubit 101 and the resonator 102.

Figure 3:
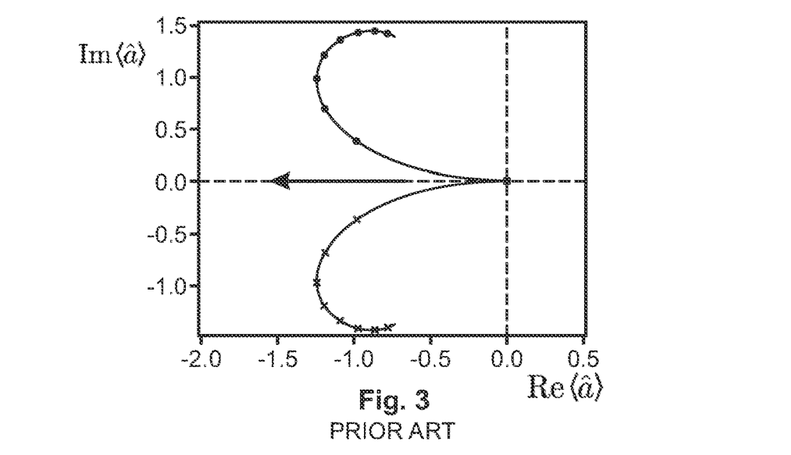
FIG. 3 illustrates the separation of state-associated probability distributions in a first case.

When the photons of the readout waveform enter the resonator 102 they interact with the state of the qubit 101. As a result the phase of the readout waveform that can be detected at the readout output port begins to change. The point in I-Q space defined by the phase and amplitude of the readout waveform must be considered as belonging to a probability distribution. FIG. 3 shows the trajectories that the mean point of the probability distribution may take in a two-dimensional I-Q space as a function of time. Here it is assumed that the injection of a readout waveform began at time t=0, and the mean point of the probability distribution is observed at intervals of 40 nanoseconds. Each circle represents the location of the mean point of the probability distribution at consecutive intervals of 40 nanoseconds if the qubit was found to be in the excited state. Correspondingly each cross represents the location of the mean point at consecutive intervals of 40 nanoseconds if the qubit was found to be in the ground state. The continuous curves represent the trajectories of the mean point between the intervals of 40 nanoseconds.

The units of the coordinate system are arbitrary, and not significant because it is the form of the trajectories that matters. FIG. 3 shows that initially the difference that depended on the state of the qubit (i.e. the shortest distance between the two trajectories) increases relatively slowly; initially the two trajectories are directed to the left from the origin, and they diverge only gradually from each other. Finding out the state of the qubit can be considered from the viewpoint of time or reliability. The more time can be waited before the detection is made, the more reliable the result will be.

Long delay in reading out the state of the qubit at reasonable reliability is disadvantageous, because it sets a limit for the speed at which those steps of quantum computing can proceed where the states must be read. It would be most desirable to have a faster way of reading out the state of a qubit; formed differently, it would be desirable to enhance the reliability at which the state of a qubit can be read after only a short delay.

A prior art document Yu Chen et al: Multiplexed dispersive readout of superconducting phase qubits, Applied Physics Letters 101, 182601 (2012) discloses a frequency-multiplexed readout scheme for superconducting phase qubits.

Another prior art document S. Touzard et al: Gated conditional displacement readout of superconducting qubits, Phys. Rev. Lett. 122, 080502, 25 Feb. 2019 discloses a new interaction between superconducting qubits and a readout cavity that results in the displacement of a coherent state of the cavity, conditioned on the stat of the qubit.

SUMMARY

It is an objective of the present invention to provide an arrangement and a method for reading out the state of a qubit with higher speed and/or better reliability than in previously known technology. Another objective of the present invention is to enable resetting the readout of the qubit as quickly as possible after the state of the qubit has been read.

The objectives of the invention are achieved by injecting readout waveforms into a system that comprises the qubit and its readout resonator through an excitation port that is also used to inject excitation waveforms to the qubit, and by performing suitable kind of phase and amplitude matching of the waveforms.

According to a first aspect there is provided an arrangement for reading out the state of a qubit. The arrangement comprises an information storage element for storing the state of the qubit and a readout resonator electromagnetically coupled to said information storage element. The arrangement comprises an excitation port for injecting excitation waveforms to the information storage element for affecting the state of the qubit, and one or more readout ports for injecting readout input waveforms to the system comprising said information storage element and said readout resonator, and for extracting readout output waveforms from the system. The arrangement comprises a readout waveform source for generating said readout input waveforms, and a readout waveform detector for detecting said readout output waveforms. Said readout waveform source is arranged to inject said readout input waveforms into the system through at least said excitation port, and said readout waveform source is configured to controllably shift a phase of a readout input waveform in the course of injecting it into the system.

According to an embodiment said excitation port is coupled to said information storage element, and one or more of said readout ports are coupled to said resonator and are different than said excitation port. This involves the advantage that various possibilities are available for injecting readout waveforms to the system.

According to an embodiment said information storage element and said readout resonator are made of superconductor materials. This involves the advantage that a working model of the system can be constructed and its performance verified with actual measurements using known technology.

According to an embodiment said information storage element is a transmon. This involves the advantage that the theory of operation of the information storage element is well known and applicable for theoretical analysis of the operation of the system.

According to an embodiment said readout waveform source is configured to inject readout waveforms into the system simultaneously both through said excitation port and through a first readout port of said one or more readout ports, said first readout port being different than said excitation port. This involves the advantage that trajectories of the probability distributions of the resonator in the I-Q space can be controlled in various ways.

According to an embodiment said readout waveform source is configured to control the phase and amplitude of both the readout waveform injected into the system through said excitation port and the readout waveform injected into the system through said first readout port. This involves the advantage that trajectories of the probability distributions of the resonator in the I-Q space can be controlled in various ways.

According to an embodiment said readout waveform source is configured to inject into the system a first pair of simultaneous readout waveforms through said excitation port and said first readout port respectively, with phases and amplitudes of said first pair of readout waveforms matched in order to maintain a mean point of a first probability distribution at the origin of an I-Q space while moving a mean point of a second probability distribution away from said origin of said I-Q space, said first probability distribution being associated with a first possible state of a qubit stored in said information storage element and said second probability distribution being associated with a second possible state of the qubit stored in said information storage element. The readout waveform source may be configured to subsequently inject into the system a second pair of simultaneous readout waveforms through said excitation port and said first readout port respectively, with phases and amplitudes of said second pair of readout waveforms matched in order to move the mean point of said second probability distribution back to the origin of the I-Q space. This involves the advantage that the resonator can be reset quickly after the readout has been performed.

According to an embodiment said readout waveform detector is configured to perform a detection of a readout output waveform extracted from the system before said subsequent injection into the system of the second pair of simultaneous readout waveforms. This involves the advantage of well synchronized readout and reset operations.

According to a second aspect there is provided a method for reading out the state of a qubit. The method comprises injecting a readout input waveform into a system that comprises an information storage element for storing the state of the qubit and a readout resonator that is electromagnetically coupled to said information storage element, and detecting a readout output waveform extracted from said system. Said injecting of the readout input waveform takes place through an excitation port that is also used to inject excitation waveforms to the information storage element for affecting the state of the qubit. A phase of the readout input waveform is controllably shifted in the course of injecting it into the system.

According to an embodiment said injecting of a readout input waveform into the system comprises injecting readout waveforms into the system simultaneously both through said excitation port and through a first readout port of said system, said first readout port being different than said excitation port. This involves the advantage that various possibilities are available for injecting readout waveforms to the system.

According to an embodiment the method comprises controlling the phase and amplitude of both the readout waveform injected into the system through said excitation port and the readout waveform injected into the system through said first readout port. This involves the advantage that trajectories of the probability distributions of the resonator in the I-Q space can be controlled in various ways.

According to an embodiment the method comprises injecting into the system a first pair of simultaneous readout waveforms through said excitation port and said first readout port respectively, with phases and amplitudes of said first pair of readout waveforms matched in order to maintain a mean point of a first probability distribution at the origin of an I-Q space while moving a mean point of a second probability distribution away from said origin of said I-Q space, said first probability distribution being associated with a first possible state of a qubit stored in said information storage element and said second probability distribution being associated with a second possible state of the qubit stored in said information storage element. The method may comprise subsequently injecting into the system a second pair of simultaneous readout waveforms through said excitation port and said first readout port respectively, with phases and amplitudes of said second pair of readout waveforms matched in order to move the mean point of said second probability distribution back to the origin of the I-Q space. This involves the advantage that the resonator can be reset quickly after the readout has been performed.

According to an embodiment the method may comprise detecting a readout output waveform extracted from the system before said subsequent injection into the system of the second pair of simultaneous readout waveforms. This involves the advantage of well synchronized readout and reset operations.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

Figure 4:
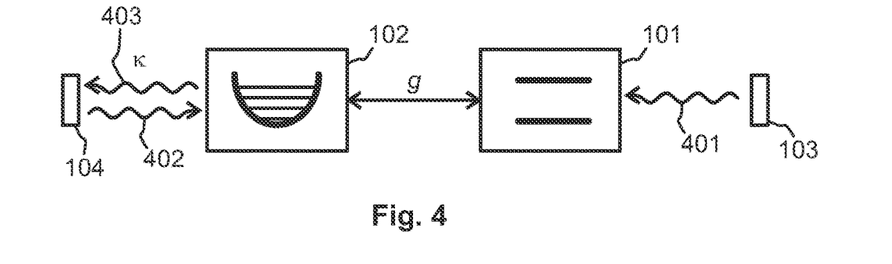
FIG. 4 illustrates a system with a qubit and a readout resonator.

FIG. 4 is a schematic illustration of the principle of an arrangement for reading out the state of a qubit. The arrangement comprises an information storage element 101 for storing the state of qubit. The two horizontal lines in the drawing mark the two possible basis states that a qubit may have. In the technical field of hardware devices for quantum computing it is customary to use the term qubit not only for the conceptual basic unit of information but also for the piece of hardware that constitutes the information storage element 101.

The arrangement comprises also a readout resonator 102 that is electromagnetically coupled to the information storage element or qubit 101. The readout resonator 102 is a harmonic oscillator and it has a certain resonance frequency. The strength of the electromagnetic coupling between the resonator 102 and the information storage element (or qubit) 101 can be described with a coupling coefficient g. For the ease of reference, the qubit 101 and its readout resonator 102 can be commonly referred to as "the system".

The arrangement comprises an excitation port 103 for injecting excitation waveforms 401 to the information storage element 101. The excitation waveforms affect the state of the qubit in the known way. In the general parlance of the technical field it is common to speak about "exciting" the qubit, which is essentially synonymous with injecting excitation waveforms through the excitation port 103.

The arrangement comprises one or more readout ports 104 for injecting readout input waveforms 402 to the system.

The one or more readout ports 104 are also used for extracting readout output waveforms 403 from the system. Injecting readout input waveforms 402 to the system is generally referred to as driving the resonator 102. A coupling coefficient κ (smallcase kappa in Greek letters) describes the characteristic decay time from the resonator 102 to the readout port(s) 104. The relative magnitudes of the constants g and κ have certain significance to the ways in which the readout mechanism operates, as will be described in more detail later in this text.

The readout input waveforms 402 originate from a readout waveform source, which is not shown in FIG. 4. Detection of readout output waveforms that are extracted from the system takes place in a readout waveform detector, which is also not shown in FIG. 4.

In contrast to what has been conventional in the technical field, the readout waveform input source may be arranged to inject at least some of the readout input waveforms into the system through at least the excitation port 103. Thus in a way the excitation port 103 becomes simultaneously one of the readout ports of the system. This has a significant effect on the speed at which reading out the state of the qubit can proceed.

Conceptually the situation can be explained as follows. In the conventional readout scheme, in which readout input waveforms were injected solely through the readout port 104, the resonator 102 was empty to begin with. The readout input waveforms, or readout photons as they are also called, had to first populate the resonator 102 before they could begin interacting with the state stored in the qubit 101. The useful information gained from the output waveform is proportional to the product of an amplitude and a phase, so only after the amplitude of the oscillations in the resonator 102 reached a meaningful magnitude and had sufficient time to interact with the state in the qubit 101 through the coupling g it became reasonable to detect their phase.

When a readout input waveform is injected into the system through the excitation port 103, it "meets" immediately the state that is stored in the qubit 101 and can thus begin interacting with it already before it ends up in the resonator 102. In other words, the resonator 102 begins to get populated with readout photons the phase of which already reflects the state of the qubit that is to be read out. As a result it becomes possible to detect appropriate readout output waveforms earlier than in the conventional method.

Figure 5:
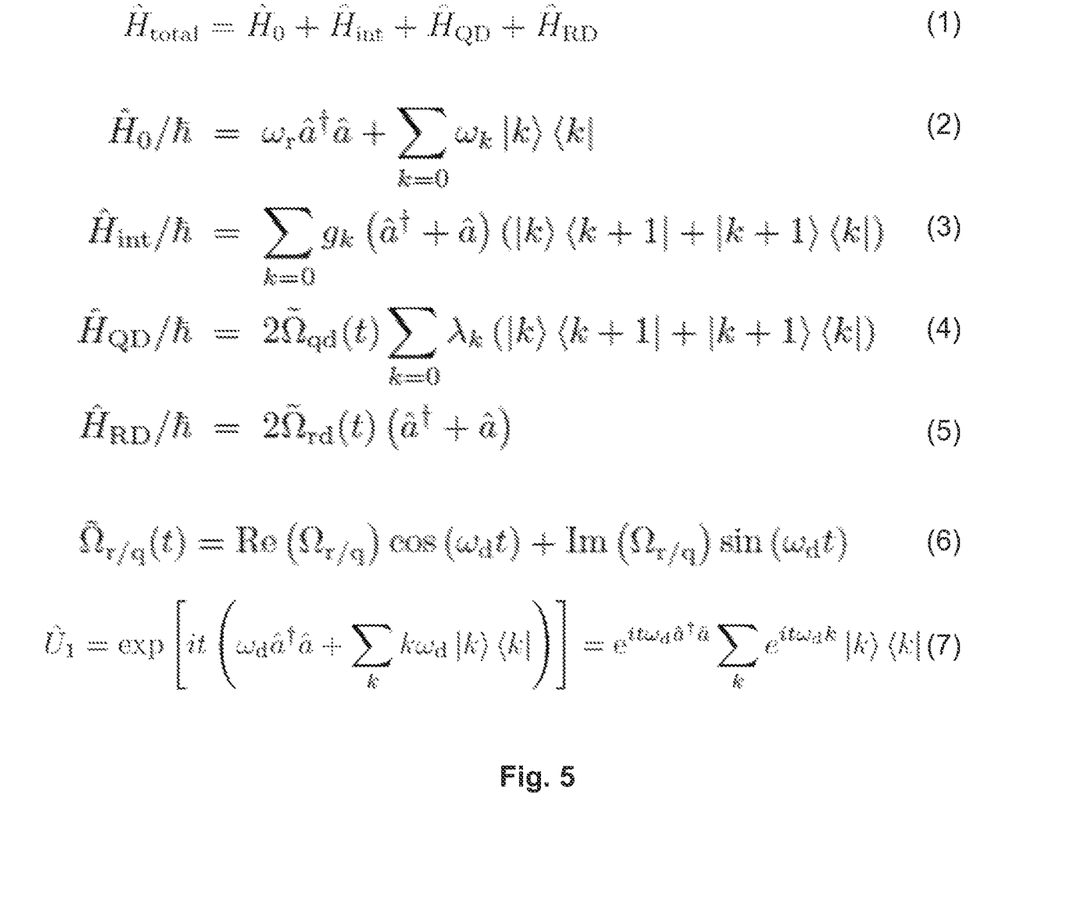
FIG. 5 illustrates a number of mathematical formulae explaining embodiments of the invention.

A more formal treatment of the situation is as follows. Let the eigenfrequencies of the uncoupled qubit 101 be $\omega_k = k\omega_r + \Delta_k$, where $\omega_r$ is the resonance frequency of the resonator 102 and $\Delta_k$ denotes the detuning between the k:th energy levels of the qubit and the resonator. $\Delta_0 = 0$ for the ground state, $\Delta_1 = \Delta$, for the first excited state, $\Delta_2 = 2\Delta + \alpha$ for the second excited state where a is the anharmonicity, and so on. In the dispersive regime the detuning is larger than the qubit-resonator coupling g, which means that $|\Delta| \gg g$. The Hamiltonian that describes the system can be written as illustrated on line (1) of FIG. 5, and the free, interaction, qubit-driving, and resonator-driving Hamiltonians are respectively given by lines (2), (3), (4), and (5) in FIG. 5.

In the mathematical notation used â denotes the annihilation operator of the resonator mode, and |k⟩ refers to the k:th eigenstate of the qubit. All subscripts "r" refer to the resonator, subscripts "q" to the qubit, and subscripts "d" to the readout (i.e. driving) waveform.

For a transmon, the coupling constants for different transmon levels are typically assumed to be of the form $g_k = g\sqrt{k+1}$, $\lambda_k = \sqrt{k+1}$. The real driving (i.e. readout) waveforms $\tilde{\Omega}_{r/q}(t)$ at driving frequency $\omega_d$ are constructed from the real and imaginary parts (i.e. I and Q quadratures) of the complex amplitudes as shown on line (6) of FIG. 5.

Figure 6:
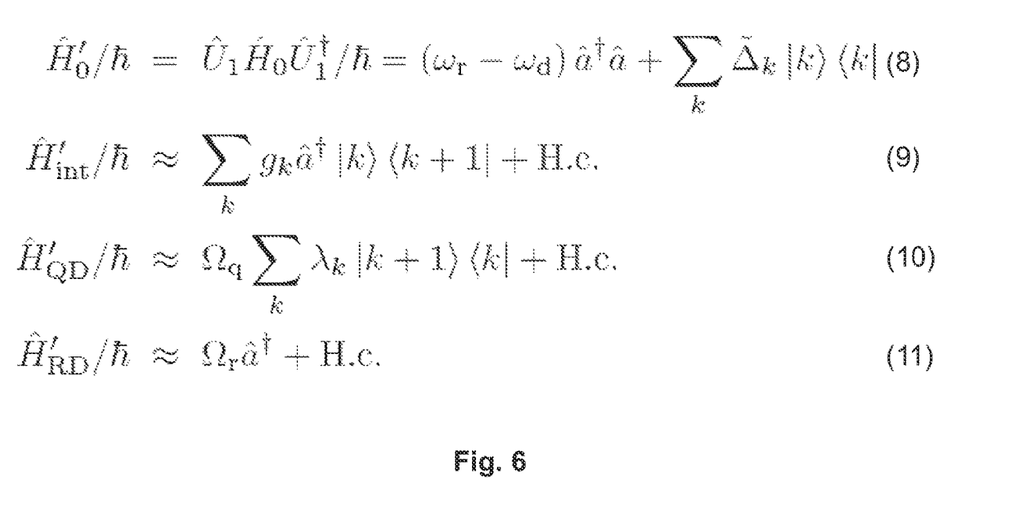
FIG. 6 illustrates a number of mathematical formulae explaining embodiments of the invention.

The Hamiltonian $\hat{H}_{total}$ can be transformed into the frame rotating at the angular frequency $\omega_d$. Applying the unitary operator $\hat{U}_1$ given on line (7) of FIG. 5 and employing the rotating wave approximations justified by $g<<|2\omega_r|$ and $|\omega_r-\omega_d|<<|\omega_r+\omega_{dr}|$ gives the transformed Hamiltonians given on lines (8), (9), (10), and (11) of FIG. 6. The acronym H.c. is used to denote the Hermitian conjugate, and $\tilde{\Delta}_k = \Delta_k + k\omega_r - k\omega_d$ denotes the shifted de-tunings.

Figure 7:
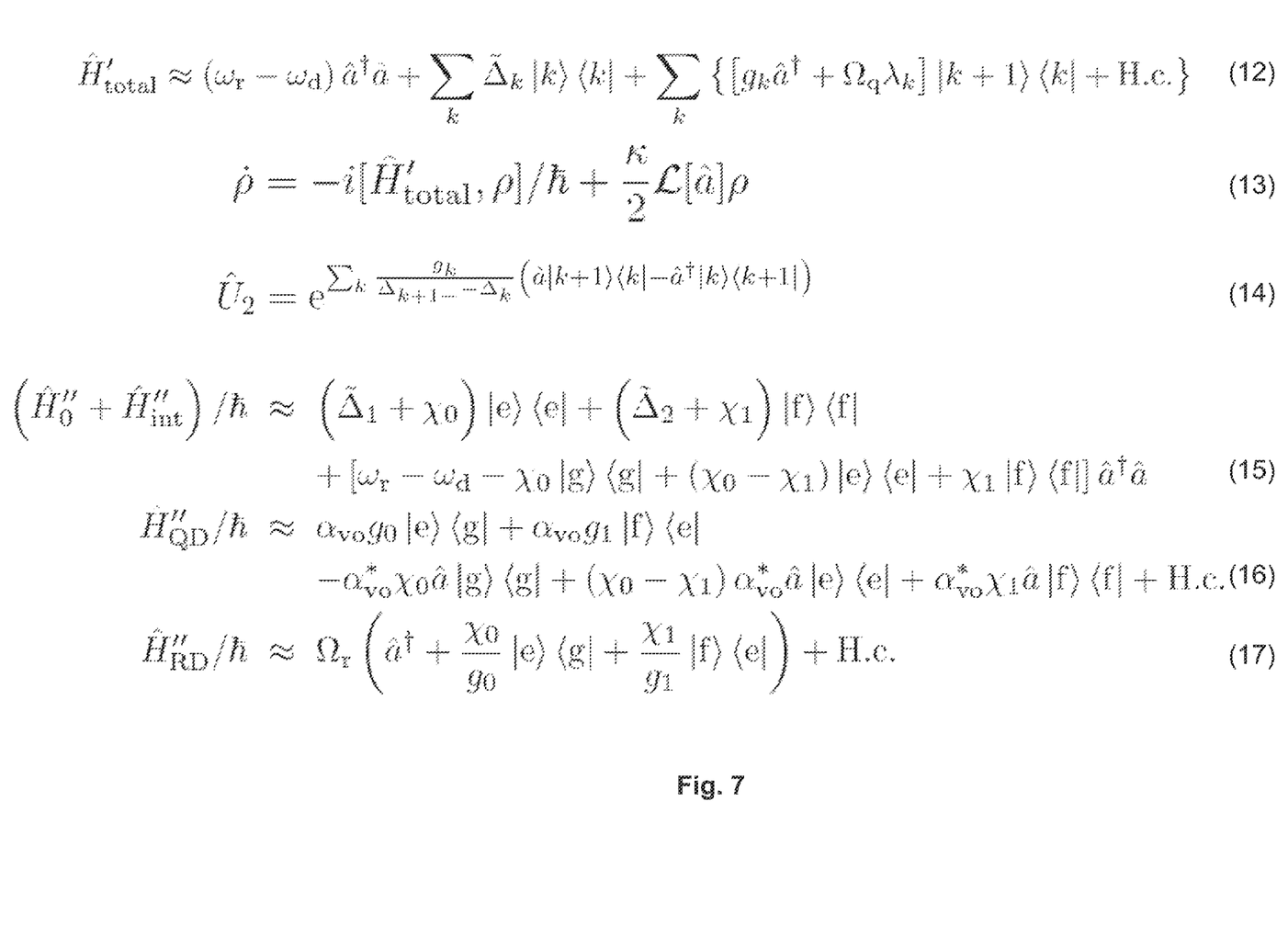
FIG. 7 illustrates a number of mathematical formulae explaining embodiments of the invention.

Ignoring $\hat{H}_{RD}'$ for a moment, the total transformed Hamiltonian $\hat{H}_{total}'$ is given by line 12 in FIG. 7.

In the conventional readout scheme, in which readout waveforms are only injected into the system through the readout port, $\Omega_d=0$. Thus the phase space distribution of the resonator will rotate about the origin at an angular frequency that depends on the state of the qubit. Here we make the key observation that the frame is displaced by $\alpha_{VO} \equiv -\Omega_d \lambda_k / g_k = -\Omega_d/g$. Thus, in the non-shifted frame, the phase space distribution of the resonator should rotate about the point $\alpha_{VO}$. The location of $\alpha_{VO}$ is fully controllable by the readout waveform, $\Omega_{qd}$ and $\omega_d$.

To account for the decay of the resonator state, we use the Lindblad master equation given on line (13) of FIG. 7, where $\rho$ is the reduced density operator of the resonator, $\kappa$ denotes the resonator energy decay rate, and $\mathcal{L}[\hat{a}]\rho = \hat{a}\rho\hat{a}^\dagger - \frac{1}{2}(\hat{a}^\dagger\hat{a}\rho + \rho\hat{a}^\dagger\hat{a})$.

To make this observation more evident, we perform the standard dispersive approximation. We begin by making another transformation using the operator $\hat{U}_2$ given by line (14) in FIG. 7. We compute $\hat{H}_i'' = \hat{U}_2 \hat{H}_i' \hat{U}_2^\dagger$ up to the second order in $g_k/\tilde{\Delta}_{k+1}$ under the assumption $g_k << \tilde{\Delta}_{k+1}$ for $\forall k$. For clarity we may restrict the formulas to only the first three levels of the transmon $(\{|g\rangle,|e\rangle,|f\rangle\}=\{|0\rangle,|1\rangle,|2\rangle\})$. The Hamiltonians assume the forms given on lines (15), (16), and (17) of FIG. 7. Here we have defined the dispersive constants $\chi_0 = g_0^2/\tilde{\Delta}_1$ and $\lambda_1 = g_1^2/(\tilde{\Delta}_2-\tilde{\Delta}_1)$, and $\Omega_{rd}' = (\neq_{rd}/2)\exp(it(\omega_r-\omega_d))$. Finally, introducing the displaced operator $\hat{b} = \hat{a} - \alpha_{VO}$, the total Hamiltonian assumes the form given on lines (18) to (21) of FIG. 8.

Figure 8:
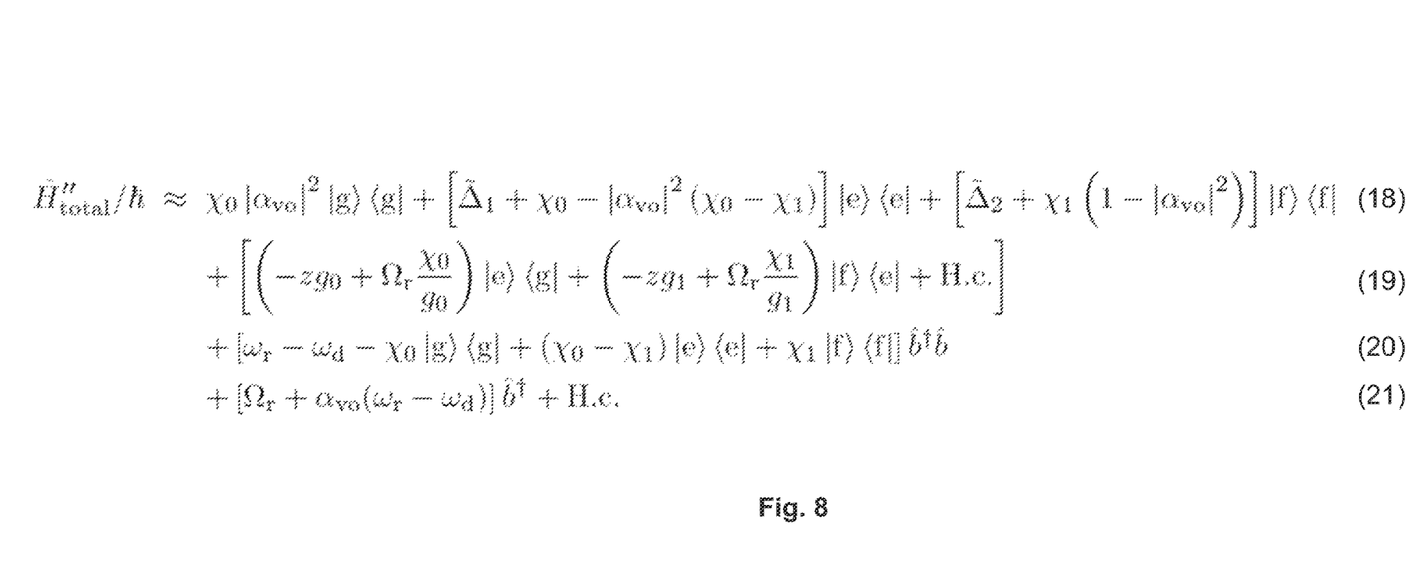
FIG. 8 illustrates a number of mathematical formulae explaining embodiments of the invention.

Line (18) describes the constant frequency shifts caused by the coupling and the driving. Line (19) shows that driving from the qubit side, i.e. injecting readout waveforms through the excitation port into the system, tilts the qubit Hamiltonian. Line (20) is important to the readout scheme considered here, because it predicts that any coherent state will rotate about point $\alpha_{VO}$. The angular frequencies of these rotations may be set to be equal to $+\chi \equiv \chi_1/2 - \chi_0$ and $-\chi$ for $\alpha_g$ and $\alpha_e$ respectively, by choosing $\omega_r - \omega_d = \chi_1/2$. Line (21) in FIG. 8 shows that the transformation has an effect on the amplitude of the resonator drive that may be compensated by changing $\Omega_r$. The Hamiltonian of a conventional dispersive system is obtained by setting $\alpha_{VO}=0$.

Figure 9:
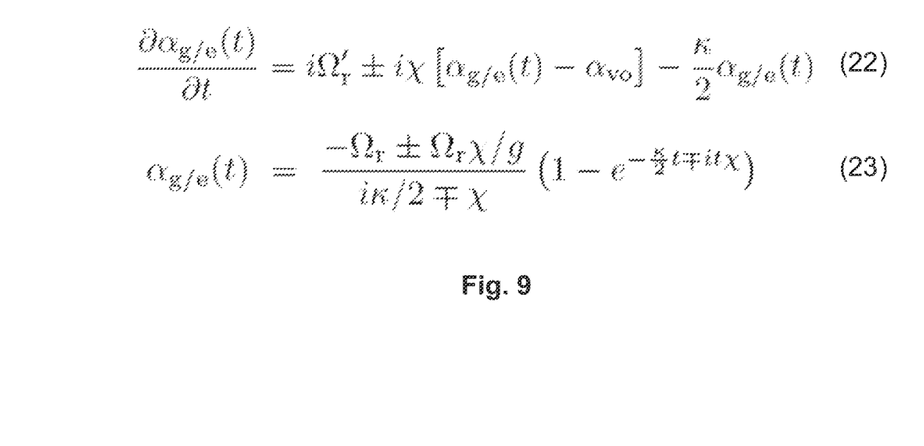
FIG. 9 illustrates a number of mathematical formulae explaining embodiments of the invention.

Using the equation on line (13) of FIG. 7 with the approximate Hamiltonian $\hat{H}_{total}'$ we obtain an analytical equation for the expectation value $\alpha_j = \langle \hat{a} \rangle_j$, $j \in \{g,e\}$ as line (22) in FIG. 9. Assuming that the resonator is empty to start with (so-called "vacuum state") and that the readout pulses do not change, $\partial \alpha_{VO}/\partial t = 0$, the solution is given on line (23) of FIG. 9.

The formal treatment given above is valid for a general case, and it is not bound to e.g. any particular physical implementation of the qubit. The following three special cases can be noted.

Figure 10:
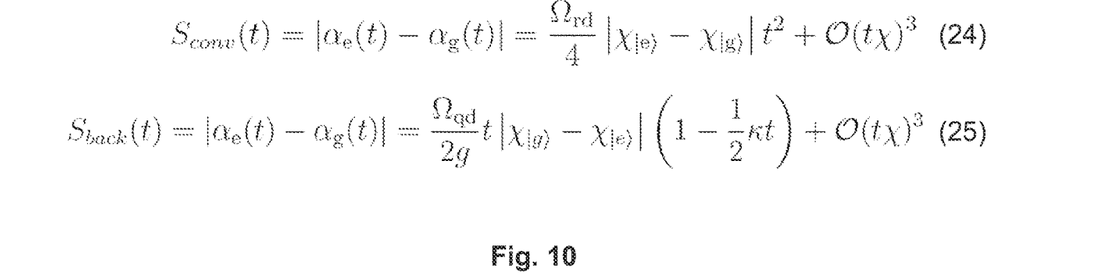
FIG. 10 illustrates a number of mathematical formulae explaining embodiments of the invention.

The first special case is a conventional readout scheme in which no readout waveforms are injected to the system through the excitation port, meaning that $\Omega_{qd}=0$. In that case the probability distributions associated with the two qubit states $|g\rangle$ and $|e\rangle$ will rotate around different points in the phase space. They will initially advance in the same direction, as was described above in association with the trajectories shown in FIG. 3. The state separation at $t<\chi^{-1}$ increases quadratically in time, as shown by line (24) in FIG. 10.

The second special case is a case in which readout waveforms are injected to the system only through the excitation port, meaning that $\Omega_{rd}=0$. This readout scheme may be called the back door readout scheme to illustrate its difference to the conventional alternative. The probability distributions associated with the two qubit states $|g\rangle$ and $|e\rangle$ will rotate around point z, but at different frequencies. The state separation at $t<\chi^{-1}$ increases linearly in time, as shown by line (25) in FIG. 10. Further evolution depends on the magnitude of $\kappa$. For small $\kappa$, the probability distributions will rotate around z while converging slowly to their respective steady states. This may make single shot readout more challenging as $S_{back}$ will oscillate. The same possible problem exists also in the conventional readout scheme, but it can be avoided by having a large $\kappa$.

The third special case is to inject readout waveforms into the system through both the excitation and readout ports, in such a way that the numerator in Equation (23) equals zero in FIG. 9. This will cause the probability distribution associated with the qubit state $|g\rangle$ to remain at the origin. The probability distribution associated with the qubit state $|e\rangle$ will rotate around point $\alpha(1-\chi_{|g\rangle}/\chi_{|e\rangle})$. The state separation at $t<\chi^{-1}$ increases as in the previous case, i.e. as $S_{back}(t)$.

Figure 11:
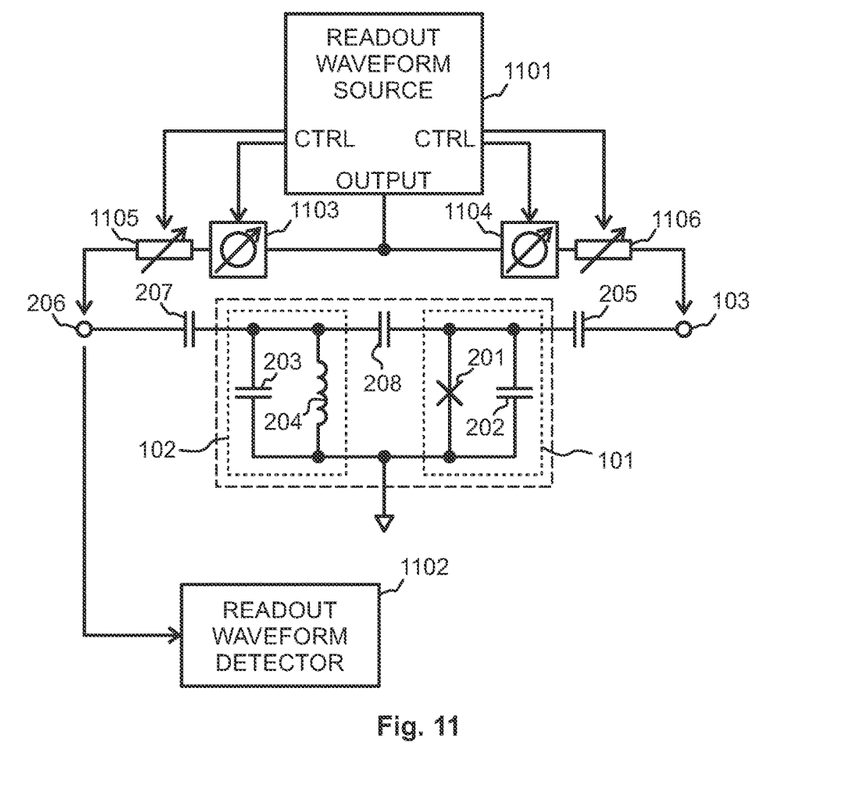
FIG. 11 illustrates an arrangement for reading out the state of a qubit.

FIG. 11 illustrate an arrangement for reading out the state of a qubit 101, in which the equivalent circuit diagram representation of FIG. 2 is adopted for illustrative comparison. The arrangement comprises a readout waveform source 1101 for generating readout input waveforms. The arrangement comprises also a readout waveform detector 1102 for detecting readout output waveforms extracted from the system that comprise the qubit (or information storage element) 101 and the readout resonator 102. The readout waveform source 1101 is arranged to inject readout input waveforms into the system through at least the excitation port 103. In the embodiment shown in FIG. 11 the readout waveform source 1101 is additionally arranged to inject readout input waveforms into the system through the readout port 206.

The readout waveform source 1101 is arranged to controllably shift the phases of readout input waveforms in the course of injecting them into the system.

This capability is schematically illustrated in FIG. 11 with the controllable phase shifters 1103 and 1104 in the lines leading from the output of the readout waveform source 1101 to the readout and excitation ports 206 and 103 respectively. The readout waveform source 1101 may also be arranged to control the amplitude of the readout input waveforms. This capability of the readout waveform source 1101 is schematically illustrated in FIG. 11 with the controllable attenuators 1105 and 1106 in the lines leading from the output of the readout waveform source 1101 to the readout and excitation ports 206 and 103 respectively.

As shown in FIG. 11, the excitation port 103 is coupled to the qubit (or information storage element) 101, and the readout port 206 is coupled to the resonator 102. To be quite exact, since the excitation port 103 doubles as a readout port (because readout input waveforms are injected there-through) in FIG. 11, it may be said that one other readout port 206 that is different than the excitation port 103 is coupled to the resonator 102.

The qubit (or information storage element) 101 and the resonator 102 can be made of superconductor materials: as an example, they may appear on a superconductive quantum memory circuit like that shown in FIG. 1. However, this is not an essential requirement, and other kinds of qubit technologies could be used. A superconductor material means here a material that can be made superconductive by cooling it to a sufficiently low temperature. An example of such materials is aluminum, but also other superconductor materials like molybdenum, niobium, tin, tantalum, or lead can be used.

For operation, a superconductive quantum memory circuit is cooled to a very low temperature, which can be some kelvins, or well under one kelvin, or in the order of some tens of millikelvins. The qubit 101 is preferably an anharmonic oscillator, such as a transmon.

Figure 12:
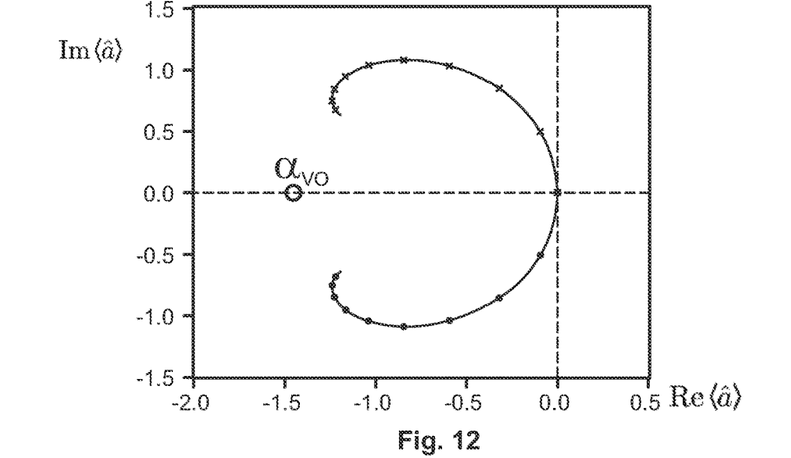
FIG. 12 illustrates the separation of state-associated probability distributions in a second case.

FIG. 12 shows an example of how the mean points of the two probability distributions associated with the two qubit states |g⟩ and |e⟩ may move in the phase space in the "back door readout" case. This refers to the case in which the readout waveform source 1101 injects readout waveforms to the system only through the excitation port 103. The graphical notation in FIG. 12 is the same as in FIG. 3 earlier.

Figure 13:
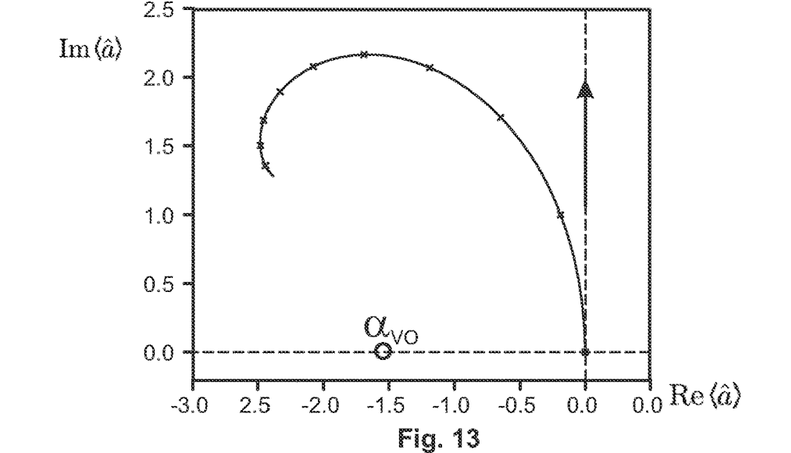
FIG. 13 illustrates the separation of state-associated probability distributions in a third case.

FIG. 13 shows an example of how the mean points of the two probability distributions associated with the two qubit states |g⟩ and |e⟩ may move in the phase space in the "asymmetric back door readout" case. This refers to the case in which the readout waveform source 1101 injects readout waveforms to the system simultaneously both through the excitation port 103 and through the readout port 206. For generality it may be said that the arrangement may comprise one or more readout ports, and port 206 is a first readout port of said one or more readout ports and different than the excitation port 103.

In particular, in the case of FIG. 13 the readout waveform source 1101 may be configured to control the phase and amplitude of both the readout waveform injected into the system through the excitation port 103 and the readout waveform injected into the system through the first readout port 206, so that the numerator equals zero in Equation (23) in FIG. 9. This makes one of the probability distributions remain at or very close to the origin of the I-Q space, while the other moves away from it along a curved trajectory.

Figure 14:
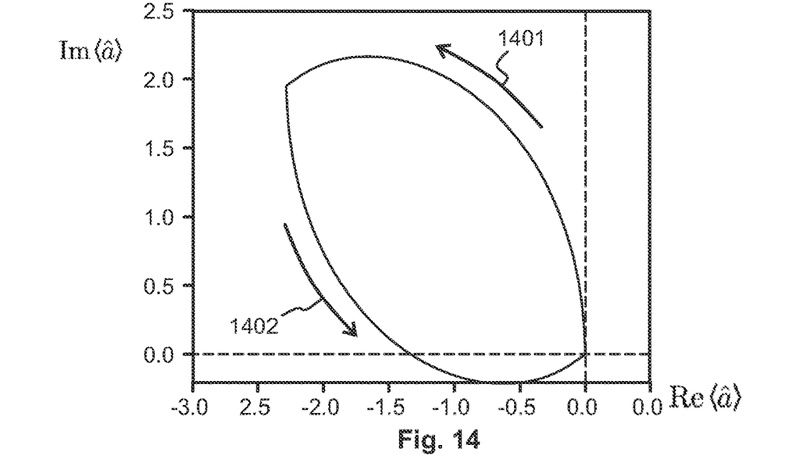
FIG. 14 illustrates the separation of state-associated probability distributions in a fourth case.

FIG. 14 illustrates how the principles considered above can be employed to perform a fast reset of the readout resonator. First, the readout waveform source 1101 injects into the system a first pair of simultaneous readout waveforms through the excitation port 103 and the readout port 206 respectively. The phases and amplitudes of this first pair of readout waveforms are matched following the principle explained above with reference to FIG. 13: the matching is made in order to maintain a mean point of a first probability distribution at the origin of an I-Q space while moving a mean point of a second probability distribution away from the origin of the I-Q space (arrow 1401). Here the first probability distribution is associated with a first possible state of a qubit stored in the information storage element 101, and the second probability distribution is associated with a second possible state of the qubit stored in the information storage element 101.

Subsequently the readout waveform source 1101 injects into the system a second pair of simultaneous readout waveforms through said excitation port and said first readout port respectively. The phases and amplitudes of this second pair of readout waveforms are matched in order to move the mean point of said second probability distribution back to the origin of the I-Q space (arrow 1402 in FIG. 14). This latter step is performed instead of just waiting that the photons of the readout waveform would naturally decay from the readout resonator, which would eventually bring the two probability distributions to the same point again in the I-Q space.

Not only the resetting of the resonator but also the detection of a readout waveform extracted from the system can take place faster than in the conventional method. The readout waveform detector 1102 may be configured to perform a detection before the latter step described above, i.e. before the readout waveform source 1101 injects the second pair of simultaneous readout waveforms to the system. Due to the linear increase in the state separation, a shorter integration time in detection gives sufficiently reliable results. If a slightly different viewpoint is taken, the detection result can be made more reliable if the same integration time is used as in the prior art method.

Figure 15:
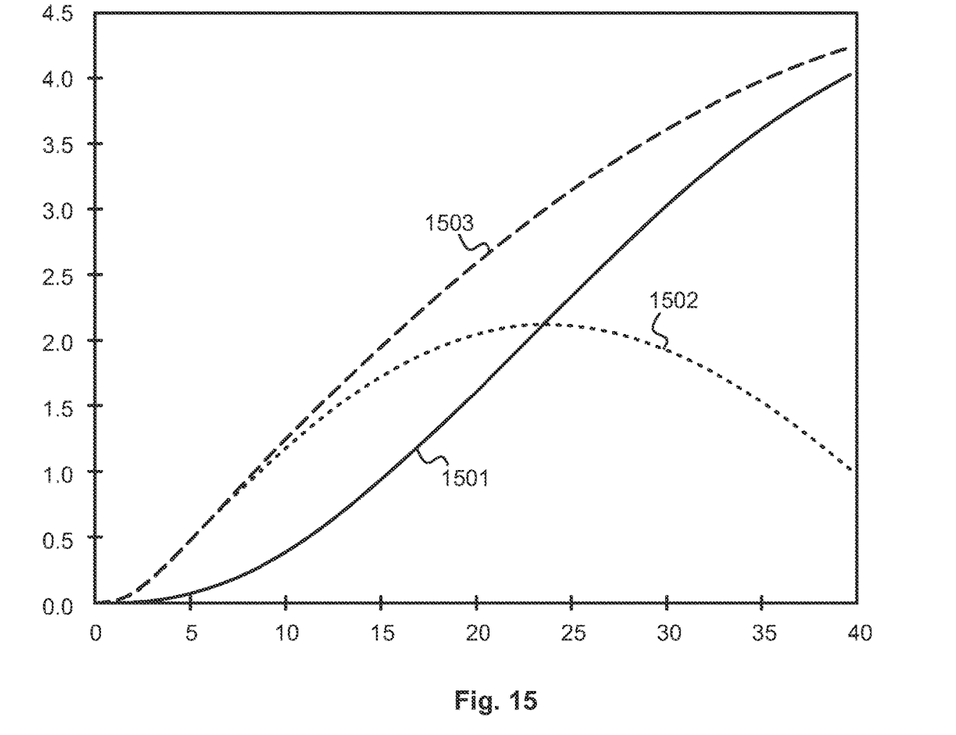
FIG. 15 illustrates a comparison of the separation of state-associated probability distributions in a number of cases.

FIG. 15 shows a graphical comparison of how the state separation develops over time in the conventional (graph 1501), back door (graph 1502), and asymmetric back door (graph 1503) readout schemes.

Figure 16:
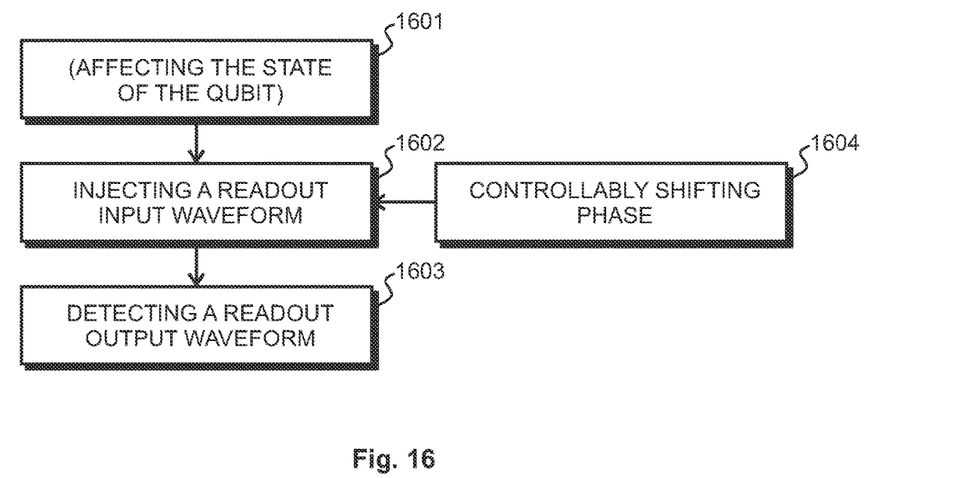
FIG. 16 illustrates steps of a method for reading out the state of a qubit.

FIG. 16 is a basic schematic illustration of a method for reading out the state of a qubit. Step 1601 represents the presumption that something may have changed the state of the qubit since it was read out last time, because otherwise there would be little reason to read it out again. Step 1602 comprises injecting a readout input waveform into a system that comprises an information storage element for storing the state of the qubit and a readout resonator that is electromagnetically coupled to said information storage element. Step 1603 comprises detecting a readout output waveform extracted from said system. In accordance with what was described above with reference to the arrangement, the injecting of the readout input waveform in step 1602 takes place through an excitation port that is also used to inject excitation waveforms to the information storage element for affecting the state of the qubit. There is also a step 1604 showing how the phase of the readout input waveform is controllably shifted in the course of injecting it into the system.

Figure 17:
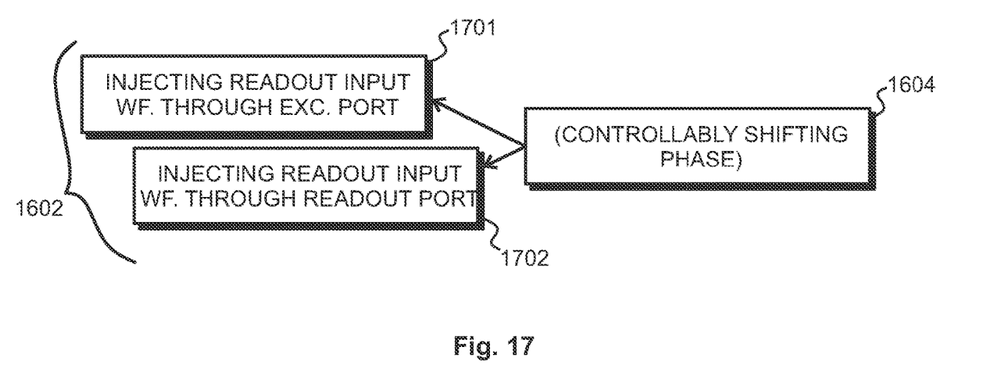
FIG. 17 illustrates steps of a method for reading out the state of a qubit.

FIG. 17 shows how the step 1602 of injecting a readout input waveform into the system may comprise injecting readout waveforms into the system simultaneously both through said excitation port (substep 1701) and through a first readout port of said system (substep 1702). For clarity it can be emphasized that here said first readout port is different than said excitation port. FIG. 17 also shows how the step 1604 of controllably shifting the phase of a readout input waveform may involve controlling the phase and amplitude of both the readout waveform injected into the system through said excitation port and the readout waveform injected into the system through said first readout port.

Figure 18:
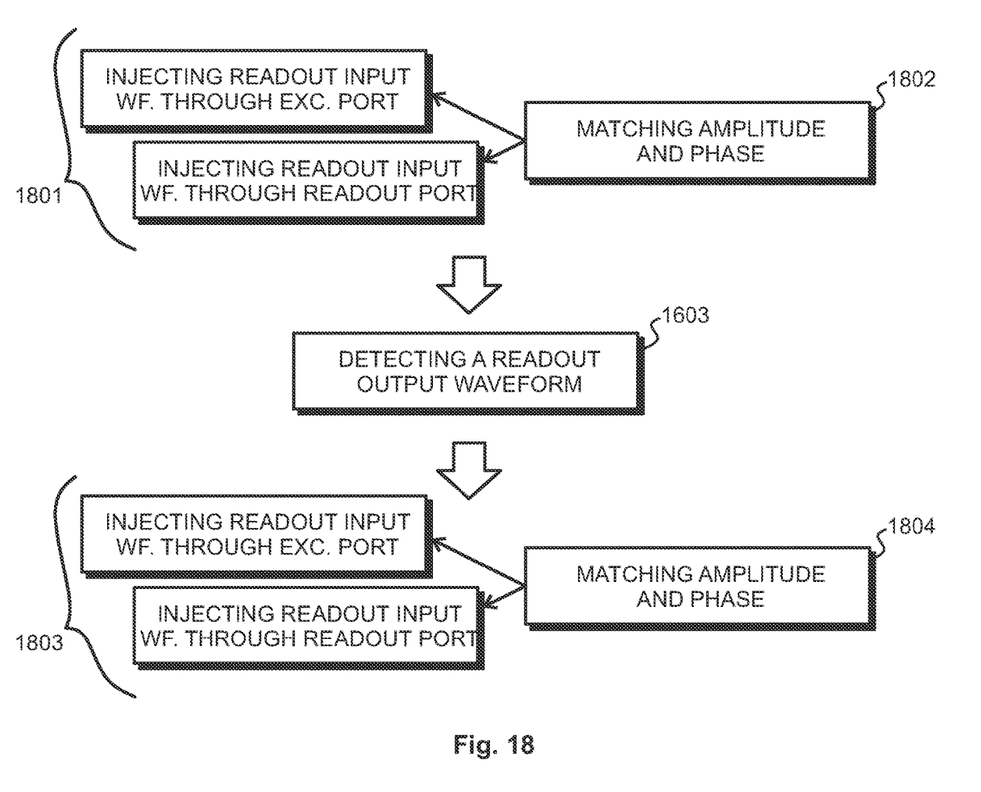
FIG. 18 illustrates steps of a method for reading out the state of a qubit.

FIG. 18 corresponds to what was previously explained with reference to FIG. 14. The method of FIG. 18 comprises injecting into the system a first pair of simultaneous readout waveforms through said excitation port and said first readout port respectively at step 1801. The phases and amplitudes of said first pair of readout waveforms may be matched according to step 1802, in order to maintain a mean point of a first probability distribution at the origin of an I-Q space while moving a mean point of a second probability distribution away from said origin of said I-Q space. Here said first probability distribution is associated with a first possible state of a qubit stored in said information storage element, and said second probability distribution is associated with a second possible state of the qubit stored in said information storage element.

The method of FIG. 18 comprises subsequently injecting into the system a second pair of simultaneous readout waveforms through said excitation port and said first readout port respectively at step 1803. The phases and amplitudes of said second pair of readout waveforms may be matched in accordance with step 1804 in order to move the mean point of said second probability distribution back to the origin of the I-Q space. The detecting of a readout output waveform extracted from the system at step 1603 may take place before said subsequent injection into the system of the second pair of simultaneous readout waveforms at step 1803.

It is obvious to a person skilled in the art that with the advancement of technology, the basic idea of the invention may be implemented in various ways. The invention and its embodiments are thus not limited to the examples described above, instead they may vary within the scope of the claims.

The invention claimed is:

1. An arrangement for reading out a state of a qubit, the arrangement comprising:
   an information storage element for storing the state of the qubit;
   a readout resonator electromagnetically coupled to said information storage element;
   an excitation port for injecting excitation waveforms to the information storage element for affecting the state of the qubit;
   one or more readout ports for injecting readout input waveforms to a system comprising said information storage element and said readout resonator, and for extracting readout output waveforms from the system;
   a readout waveform source for generating said readout input waveforms; and
   a readout waveform detector for detecting said readout output waveforms;
   wherein said readout waveform source is configured to inject said readout input waveforms into the system simultaneously both through said excitation port and through a first readout port of said one or more readout ports, said first readout port being different than said excitation port, and
   wherein said readout waveform source is configured to controllably shift a phase of a readout input waveform in the course of injecting it into the system.

2. The arrangement according to claim 1, wherein:
   said excitation port is coupled to said information storage element, and
   one or more of said readout ports are coupled to said resonator.

3. The arrangement according to claim 2, wherein said information storage element and said readout resonator are made of superconductor materials.

4. The arrangement according to claim 3, wherein said information storage element is a transmon.

5. The arrangement according to claim 1, wherein:
   said readout waveform source is configured to control the phase and amplitude of both the readout input waveform injected into the system through said excitation port and the readout input waveform injected into the system through said first readout port.

6. The arrangement according to claim 5, wherein said readout waveform source is configured to:
   inject into the system a first pair of simultaneous readout waveforms through said excitation port and said first readout port respectively, with phases and amplitudes of said first pair of readout waveforms matched in order to maintain a mean point of a first probability distribution at the origin of an I-Q space while moving a mean point of a second probability distribution away from said origin of said I-Q space, said first probability distribution being associated with a first possible state of a qubit stored in said information storage element and said second probability distribution being associated with a second possible state of the qubit stored in said information storage element; and
   subsequently inject into the system a second pair of simultaneous readout waveforms through said excitation port and said first readout port respectively, with phases and amplitudes of said second pair of readout waveforms matched in order to move the mean point of said second probability distribution back to the origin of the I-Q space.

7. The arrangement according to claim 6, wherein said readout waveform detector is configured to perform a detection of a readout output waveform extracted from the system before said subsequent injection into the system of the second pair of simultaneous readout waveforms.

8. The arrangement according to claim 5, further comprising a plurality of controllable phase shifters, wherein the readout waveform source is operably coupled to each of the information storage element and the readout resonator through a respective one of the plurality of controllable phase shifters.

9. The arrangement according to claim 5, further comprising a plurality of controllable attenuators, wherein the readout waveform source is operably coupled to each of the information storage element and the readout resonator through a respective one of the plurality of controllable attenuators.

10. A method for reading out a state of a qubit, the method comprising:
    injecting a readout input waveform into a system that comprises an information storage element for storing the state of the qubit and a readout resonator that is electromagnetically coupled to said information storage element; and
    detecting a readout output waveform extracted from said system,
    wherein said injecting of the readout input waveform takes place through an excitation port that is also used to inject excitation waveforms to the information storage element for affecting the state of the qubit, and simultaneously through a first readout port that is different than said excitation port, and
    wherein a phase of the readout input waveform is controllably shifted in the course of injecting it into the system.

11. The method according to claim 10, further comprising controlling the phase and amplitude of both the readout input waveform injected into the system through said excitation port and the readout input waveform injected into the system through said first readout port.

12. The method according to claim 11, further comprising:
    injecting into the system a first pair of simultaneous readout waveforms through said excitation port and said first readout port respectively, with phases and amplitudes of said first pair of readout waveforms matched in order to maintain a mean point of a first probability distribution at the origin of an I-Q space while moving a mean point of a second probability distribution away from said origin of said I-Q space, said first probability distribution being associated with a first possible state of a qubit stored in said information storage element and said second probability distribution being associated with a second possible state of the qubit stored in said information storage element; and
subsequently injecting into the system a second pair of simultaneous readout waveforms through said excitation port and said first readout port respectively, with phases and amplitudes of said second pair of readout waveforms matched in order to move the mean point of said second probability distribution back to the origin of the I-Q space.

13. A method according to claim 12, further comprising:
detecting a readout output waveform extracted from the system before said subsequent injection into the system of the second pair of simultaneous readout waveforms.

\* \* \* \* \*